(12) United States Patent
Kim et al.

(10) Patent No.: US 11,222,709 B2
(45) Date of Patent: Jan. 11, 2022

(54) MEMORY MODULE WITH REDUCED ECC OVERHEAD AND MEMORY SYSTEM

(71) Applicant: SAMSUNG ELECTRONICS CO., LTD., Suwon-si (KR)

(72) Inventors: Taekwoon Kim, Seoul (KR); Wonhyung Song, Osan-si (KR); Jangseok Choi, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/916,463

(22) Filed: Jun. 30, 2020

(65) Prior Publication Data

US 2021/0210156 A1 Jul. 8, 2021

(30) Foreign Application Priority Data

Jan. 8, 2020 (KR) ........................ 10-2020-0002393

(51) Int. Cl.
*G11C 29/00* (2006.01)
*G11C 29/42* (2006.01)
*G11C 29/44* (2006.01)
*G11C 29/32* (2006.01)
*G11C 29/12* (2006.01)

(52) U.S. Cl.
CPC ........ *G11C 29/42* (2013.01); *G11C 29/12015* (2013.01); *G11C 29/32* (2013.01); *G11C 29/44* (2013.01); *G11C 2029/1206* (2013.01); *G11C 2029/4402* (2013.01)

(58) Field of Classification Search
CPC ... G11C 29/42; G11C 29/12015; G11C 29/32; G11C 29/44; G11C 2029/1206; G11C 2029/4402
See application file for complete search history.

(56) References Cited

U.S. PATENT DOCUMENTS

| | | |
|---|---|---|
| 6,751,698 B1 | 6/2004 | Deneroff et al. |
| 6,832,286 B2 | 12/2004 | Johnson et al. |
| 8,060,692 B2 | 11/2011 | Christenson et al. |
| 9,691,505 B2 | 6/2017 | Das et al. |
| 9,772,900 B2 | 9/2017 | Hu et al. |
| 2004/0163028 A1 | 8/2004 | Olarig |
| 2015/0302904 A1 | 10/2015 | Yoon et al. |
| 2018/0074893 A1 | 3/2018 | Vaidhyanathan et al. |
| 2018/0189132 A1 | 7/2018 | Malladi et al. |
| 2018/0210787 A1* | 7/2018 | Bains .................. G06F 11/1068 |
| 2018/0217894 A1* | 8/2018 | Park .................. G11B 20/1833 |
| 2018/0351574 A1 | 12/2018 | Ware et al. |
| 2019/0121695 A1 | 4/2019 | Son |
| 2019/0163565 A1 | 5/2019 | Meaney et al. |
| 2021/0133028 A1* | 5/2021 | Kim .................... G06F 11/1004 |

* cited by examiner

*Primary Examiner* — Tuan T Nguyen
(74) *Attorney, Agent, or Firm* — Volentine, Whitt & Francos, PLLC

(57) ABSTRACT

A memory system includes a memory module and a memory controller. The memory module includes data chips that store data and are assigned to a first sub-channel that generates a first code word or a second sub-channel that generates a second code word, where the first code word and the second code are used to fill a single cache line. The memory controller, upon detection of a hard-fail data chip among the data chips, copies data from the hard-fail data chip to the ECC chip, releases mapping between the hard-fail data chip and corresponding I/O, and defines new mapping between the ECC chip and the corresponding I/O pins.

9 Claims, 16 Drawing Sheets

PM

| Pin# | Pin_name | Chip# |
|------|----------|-------|
| 7 | DQ1_A | 210a |
| 16 | DQ5_A | 210a |
| 18 | DQ8_A | 210b |
| 20 | DQ9_A | 210b |
| 42 | DQ25_A | 210d |
| 111 | DQ8_B | 210f |
| ⋮ | ⋮ | ⋮ |
| 140 | DQ28_B | 210h |

MEMORY MODULE WITH REDUCED ECC OVERHEAD AND MEMORY SYSTEM

CROSS-REFERENCE TO RELATED APPLICATION(S)

This application claims the benefit of priority to Korean Patent Application No. 10-2020-0002393 filed on Jan. 8, 2020 in the Korean Intellectual Property Office, the subject matter of which is hereby incorporated by reference.

BACKGROUND

1. Field

The inventive concept relates generally to memory modules and memory systems including memory modules.

2. Description of Related Art

Contemporary servers require robust error detection and correction capabilities —often involving error correction code (ECC) features and functions—to ensure high reliability, availability and serviceability (RAS) features. As more devices and operations are required to meet this demand, however, ECC overhead increases and this can become an issue. For example, in a case wherein a chip-kill operation involving replacement of a hard fail memory device with a spare device, additional memory channels and memory devices are required. In this regard, it may be very difficult to reduce the ECC overhead while maintaining the RAS.

SUMMARY

Embodiments of the inventive concept provide a memory module capable of performing a chip-kill operation using a reduced number of memory chips.

According to certain embodiments, a memory module includes; a plurality of data chips configured to store data, wherein each one of the plurality of data chips is assigned to one of a first sub-channel that generates a first code word and a second sub-channel that generates a second code word, and the first code word and the second code are used to fill a single cache line, an error correction code (ECC) chip configured to store ECC associated with the data, and a registered clock driver (RCD) controller configured to control operation of the ECC chip. The memory module also includes a memory controller configured, upon detection of a hard-fail data chip among the plurality of data chips, to copy data from the hard-fail data chip to the ECC chip, release mapping between the hard-fail data chip and corresponding input/output (I/O) pins among a plurality of I/O pins, and define new mapping between the ECC chip and the corresponding I/O pins.

According to certain embodiments, a memory module includes; a first data chip, a second data chip, a third data chip, a fourth data chip, a fifth data chip, a sixth data chip, a seventh data chip and an eighth data chip (inclusively, first to eight data chips), each respectively configured to store data, a registered clock driver (RCD) controller configured to control the first to eighth data chips in response to at least one of an address signal, a command signal and a clock signal received from a memory controller, a serial presence detect (SPD) configured to store device information associated with the memory module and a power management integrated circuit (PMIC) configured to supply power to the first to eighth data chips. The first data chip, the second data chip, the third data chip and the fourth data chip are assigned to a first sub-channel, and the fifth data chip, the sixth data chip, the seventh data chips and the eighth data chips are assigned to a second sub-channel, and at least one predetermined region among the first to eighth data chips is allocated as an error correction code (ECC) chip that stores ECC associated with the data.

According to certain embodiments, a memory module includes; a first data chip, a second data chip, a third data chip, a fourth data chip, a fifth data chip, a sixth data chip, a seventh data chip, an eighth data chip, a nineth data chip, a tenth data chip, an eleventh data chip, a twelfth data chip, a thirteenth data chip, a fourteenth data chip, a fifteenth data chip and a sixteenth data chip (inclusively, first to sixteenth data chips), each respectively configured to store data, a plurality of error correction code (ECC) chips configured to store ECC associated with the data, a registered clock driver (RCD) controller configured to control the plurality of ECC chips and the first to sixteenth data chips, and a plurality of input/output (I/O) pins mapped to the plurality of ECC chips and the first to sixteenth data chips, wherein first to eighth data chips among the first to sixteenth data chips are assigned to a first sub-channel, and ninth to sixteenth data chips among the first to sixteenth data chips are assigned to a second sub-channel, and the first to sixteenth data chips share the plurality of ECC chips.

BRIEF DESCRIPTION OF DRAWINGS

The above and other aspects, features and other advantages of the present disclosure will be more clearly understood from the following detailed description taken in conjunction with the accompanying drawings, in which:

FIG. 6 a diagram illustrating a pin-map applicable to the memory module of FIG. 5;

DETAILED DESCRIPTION

Certain embodiments of the inventive concept will now be described in some additional detail with reference to the accompanying drawings. Throughout the written description and drawings, like reference numbers and labels are used to denote like or similar elements.

Figure 1:
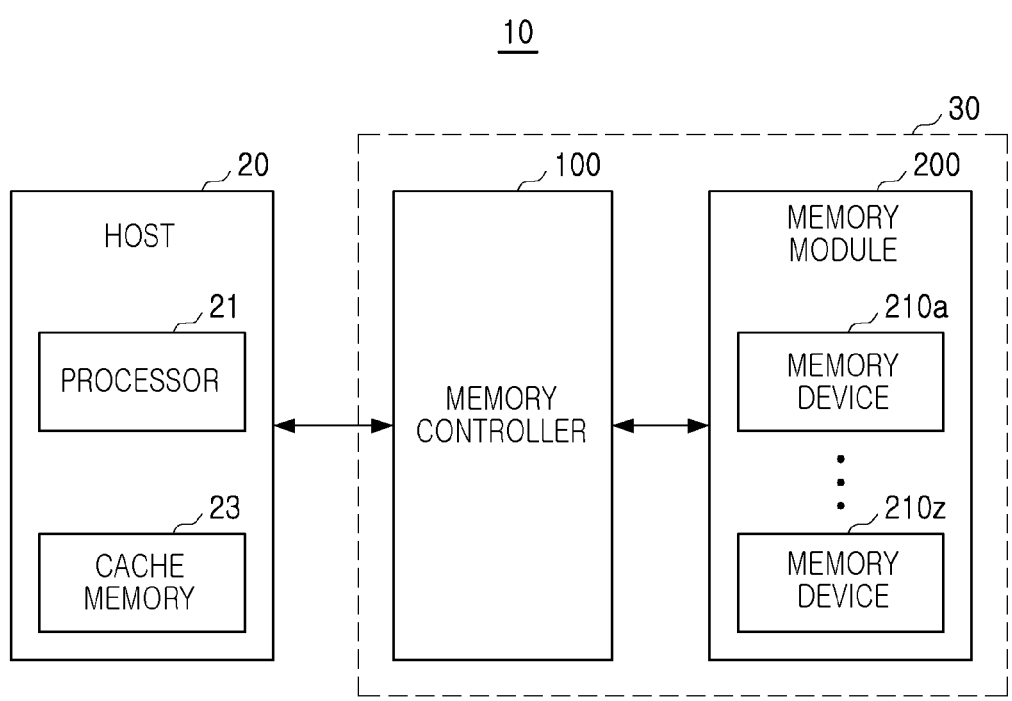
FIG. 1 is a diagram illustrating a computing system according to an exemplary embodiment of the present disclosure.

FIG. 1 is a block diagram illustrating a computing system 10 according to embodiments of the inventive concept. Here, the computing system 10 generally includes a host 20 and a memory system 30.

The host 20 may communicate (i.e., transmit and/or receive signals) with the memory system 30 via a single channel. One or more interface(s) may be used to facilitate (e.g., define requisite signal and data formats, etc.) communication between the host 20 and the memory system 30. For example, the host 20 may use an interface protocol, such as Advanced Technology Attachment (ATA), serial ATA (SATA), parallel ATA (PATA), Peripheral Component Interconnection (PCI), PCI express (PCIe), serial attached SCSI (SAS), Universal Serial Bus (USB), Multi-Media Card (MMC), Enhanced Small Disk Interface (ESDI), Integrated Drive Electronics (IDE), or the like, to communicate with the memory system 30.

The host 20 may include a processor 21 and a cache memory 23.

The processor 21 may include Central Processing Unit (CPU), Graphic Processing Unit (GPA), Application Unit (AP), or the like. The processor 21 may perform a data operation using the cache memory 23.

The cache memory 23 may store data read from the memory system 30 in a unit of cache line. The cache line may refer to a virtual space of the cache memory, in which data is stored. A size of the cache line may be determined according to design or related specification. For example, the cache line may include 256 bytes of data and 32 bytes of an error correction code (ECC). Alternately, the cache line may include 256 bytes of data, 32 bytes of cyclic redundancy code (CRC), and 32 bytes of parity data.

The memory system 30 may include a memory controller 100 and a memory module 200. The memory module may include a plurality of memory devices 210a to 210z.

The memory controller 100 is configured to control overall operations of the memory system 30 and data exchange between the host 20 and the memory module 200. For example, the memory controller 100 may communicate various commands to the memory devices 210a to 210z to control constituent operations. Further, the memory controller 100 may control the memory devices 210a to 210z at a request of the host 20 to write and/or read data.

Figure 2:
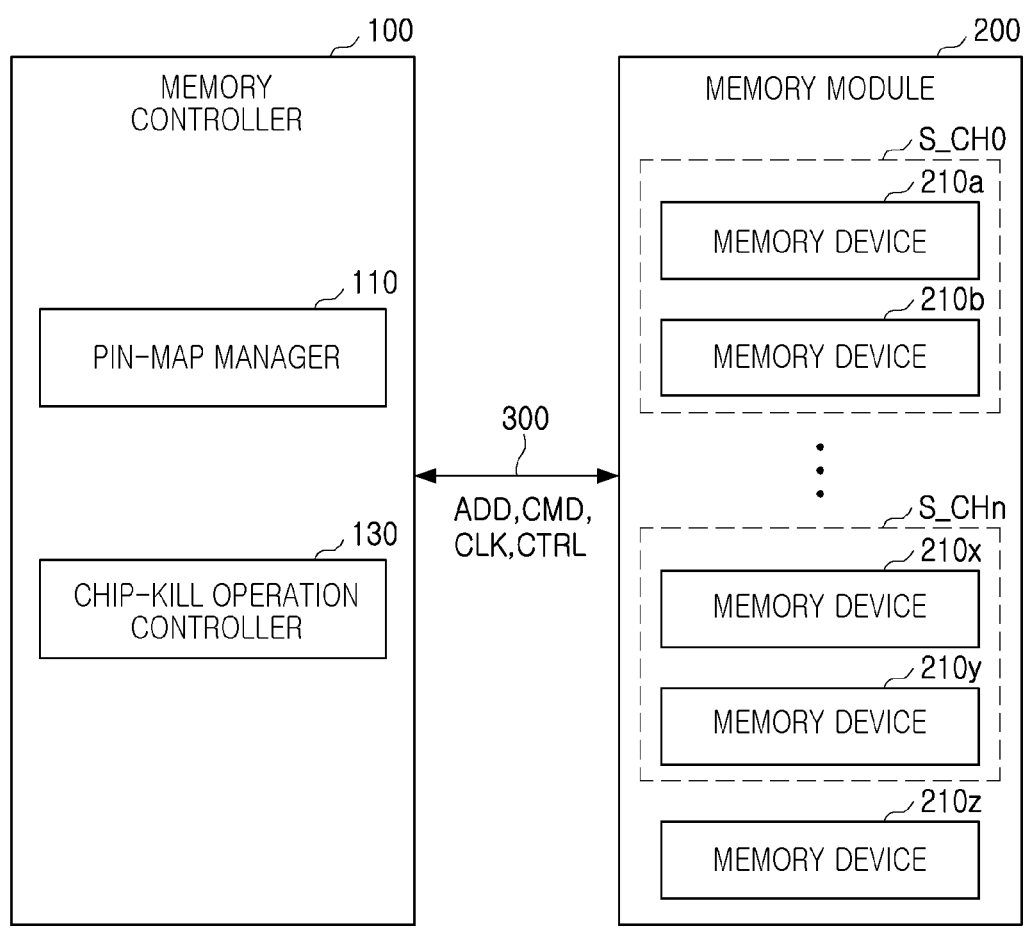
FIG. 2 is a diagram illustrating a memory system according to an exemplary embodiment.
Figure 3:
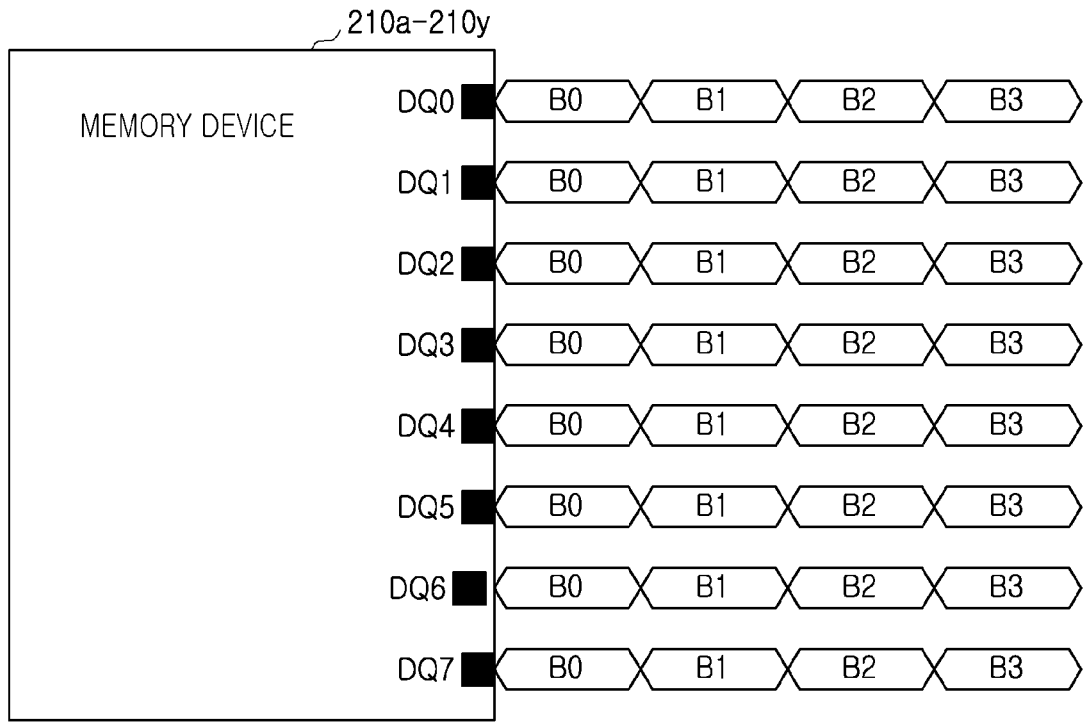
FIG. 3 is a diagram illustrating a burst operation of a memory system according to an exemplary embodiment.
Figure 4:
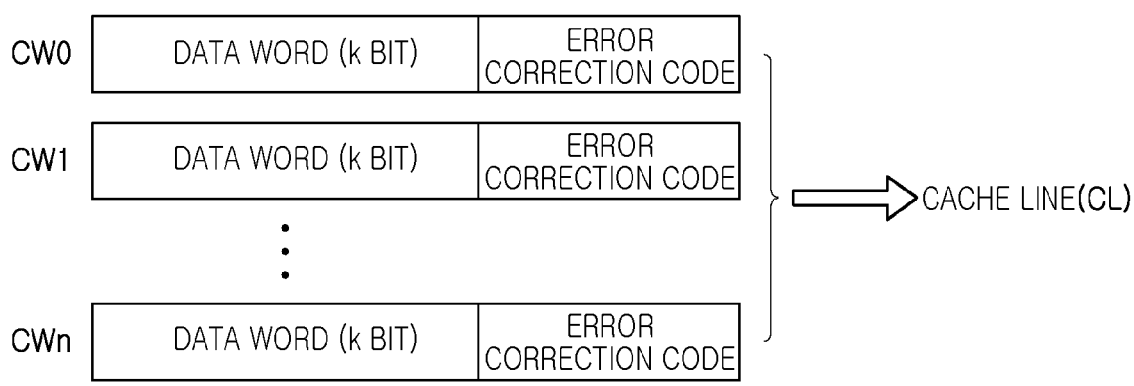
FIG. 4 is a diagram illustrating a method for filling a cache line by configuring a lockstep mode by a memory system according to an exemplary embodiment.

Hereafter, a memory system according to an embodiment of the inventive concept will be described in some additional detail with reference to FIGS. 2, 3 and 4, wherein FIG. 2 is a block diagram further illustrating in one example the memory system 30 of FIG. 1; FIG. 3 is a conceptual diagram illustrating a burst operation that may be performed by the memory system 30 of FIGS. 1 and 2; and FIG. 4 is a conceptual diagram illustrating one possible method that may be used to fill a cache line by configuring a lockstep mode in the memory system 30 according to embodiments of the inventive concept.

As noted above and referring to FIGS. 1 and 2, the memory system 30 may include the memory controller 100 and the memory module 200, where the memory module may include a plurality of memory devices 210a to 210z. Thus, FIG. 2 assumes a memory system including a single memory controller 100 and a single memory module 200, but this is merely one example selected for convenience for description and the inventive concept is not limited thereto. For example, the memory system 30 may include a multiple memory modules and more than one memory controllers.

The memory controller 100 may communicate various signals and data with the memory module 200 via a bus 300. For example, the memory controller 100 and the memory module 200 may communicate address signal(s) ADD, command signal(s) CMD, clock signal(s) CLK, and/or control signal(s) CTRL via the bus 300. The memory controller 100 may also communicate "write data" to be written to the memory module and/or "read data" retrieved from the memory module 200 via the bus 300.

In certain embodiments of the inventive concept like the one illustrated in FIG. 2, the memory controller 100 may include a pin-map manager 110 and a chip-kill operation controller 130.

The pin-map manager 110 may be used to store and manage mapping information between a plurality of the memory devices 210a to 210z and data input/output (I/O) pins (or DQ pins) of the memory module 200.

The chip-kill operation controller 130 may be used to control a chip-kill operation that involves the replacement of a "hard-fail memory device" among the memory devices 210a to 210z with a "spare memory device." In this regard, the memory controller 100 may be configured to detect a hard-fail memory device (e.g., a hard-fail memory chip) among the memory devices 210a to 210z during operation (or upon start up) of the memory system 10. And upon detecting the occurrence of the hard fail in at least one of the memory devices 210a to 210z, the chip-kill controller 130 may copy data stored in the hard-fail memory device to the spare device, and remap the data I/O pins mapped in the hard-fail memory device using the pin-map manager 110.

The memory controller 100 may issue one or more mode register set (MRS) command(s) via the bus 300 to the memory devices 210a to 210z. That is, at one time (e.g., simultaneously or in following sequence) the memory controller 100 may "set" (or define) the mode registers of the memory devices 210a to 210z using a single MRS command or a sequence of individual memory device MRS commands.

The plurality of the memory devices 210a to 210z included in the memory module 20 of FIG. 2 may be one or more types of volatile memory, such as dynamic random access memory (DRAM), synchronous DRAM (SDRAM), double data rate SDRAM (DDR SDRAM), low power double data rate SDRAM (LPDDR SDRAM), rambus DRAM (RDRAM), static RAM (SRAM), or the like, or a non-volatile memory, such as phase-change RAM (PRAM), magnetoresistive RAM (MRAM), resistive RAM (Re-RAM), ferro-electric RAM (FRAM), flash memory, or the like.

Each of the memory devices 210a to 210z may include a data bus having a width (e.g.,) of 4 bits (X4), 8 bits (X8), 16 bits (X16), 32 bits (X32), or the like, and the memory devices 210a to 210z will operate according to data bus width characteristics. For example, an X8 memory device may communicate data with the memory controller 100 via eight (8) I/O pins.

Each memory device among the memory devices 210a to 210z capable of communicating and storing data (e.g., content data or payload data) may be referred as a "data chip." In contrast, a memory device among the memory devices 210a to 210z may be used to communicate and store error correction code (ECC) associated with the data, and may be referred as an "ECC chip." FIG. 2 assumes an example in which the memory module 200 includes a single ECC chip (e.g., memory device 210z), but the number of memory devices designated as ECC chips may vary with design and/or specification.

The memory devices 210a to 210z of FIG. 2 may perform a burst operation of the type commonly used to communicate a large volume of data by sequentially indexing (e.g., increasing or decreasing) addresses beginning with an initial address received from the memory controller 100. The basic unit of a burst operation may refer to a "burst length" BL. Here, the burst length may refer to a number of data units (e.g., bits) communicated during execution of the burst operation.

In the illustrated example of FIG. 3, when a burst length BL is assumed to be sixteen (16) and a number of the data chips 210a to 210y is assumed to be eight (8), four (4) data units B0 to B3 may be sequentially communicated via eight (8) I/O pins DQ0 to DQ7 respectively associated with each of the data chips 210a to 210y. That is, assuming a X8 data bus width for the data chips 210a to 210y, each of the data chips 210a to 210y may include eight (8) I/O pins DQ0 to DQ7. Following these illustrative assumptions, the amount of data communicated by each of the data chips 210a to 210y during a burst operation may be equal to four (4) (i.e., the number of data bits sequentially communicated per I/O pin) times eight (8) (i.e., the data bus width), or 32 bits.

Accordingly, the data communicated by from the eight (8) data chips 210a to 210y during the burst operation may be 32 (i.e., the number of bits per data chip) times eight (8) (i.e., the number of data chips), or 256 bits. Thus, in the foregoing example, the memory system 30 of FIGS. 1 and 2 may "fill" one cache line using 256-bit data during a burst operation.

Referring still to FIGS. 1 and 2, the memory module 200 may communicate data using a plurality of sub-channels (e.g., S_CH0 to S_CHn), wherein each sub-channel is associated with one or more of the data chips 210a to 210y. That is, each data chip among the data chips 210a to 210y is respectively allocated (or "assigned") to one of the plurality of sub-channels S_CH0 to S_CHn. In this manner, the memory module 200 may create a plurality of code words using a data word read from each of the sub-channels S_CH0 to S_CHn and ECC provided by the ECC chip 210z corresponding to each data word. In some exemplary embodiments, the size of the code word generated by the memory module 200 may be 288 bits, (e.g., the 256-bit-data word plus a 32 bit-ECC). However, once again this is just an illustrative example and the size of the code word(s) generated by memory systems according to embodiments of the inventive concept may vary by design or specification.

In this regard and referring to FIG. 4, the memory module 200 may configure the sub-channels S_CH0 to S_CHn in a lockstep mode of operation. In this case, and as will be described in some additional detail with reference to FIG. 4, the memory module 200 may use code words CW0 to CWn respectively generated by the sub-channels S_CH0 to S_CHn and having a k-bit data word size to fill a single cache line CL including (k×n) bit data, where 'k' and 'n' are positive real integers. For example, assuming a burst length BL of sixteen (16) and 2 sub-channels—respectively including four (4) X8 data chips—the code word for each sub channel will include four (4) (i.e., the number of data bits provided per I/O pin) times eight (8) (i.e., the data bus width) times four (4) (i.e., the number of data chips), or a 128 bit data word. In this case, the memory module 200 may fill a single cache line CL using the 128-bit data word per sub-channel.

When the memory module 200 configures the sub-channels S_CH0 to S_CHn in the lockstep mode, the sub-channels S_CH0 to S_CHn may share at least one ECC chip 210z in order to perform an extended ECC operation. In this case, the ECC chip 201z may be provided as a spare chip, and the memory system 30 uses the spare chip 201z to perform the chip-kill operation involving the replacement of a hard-fail memory chip among the data chips 201a to 201y.

Figure 5:
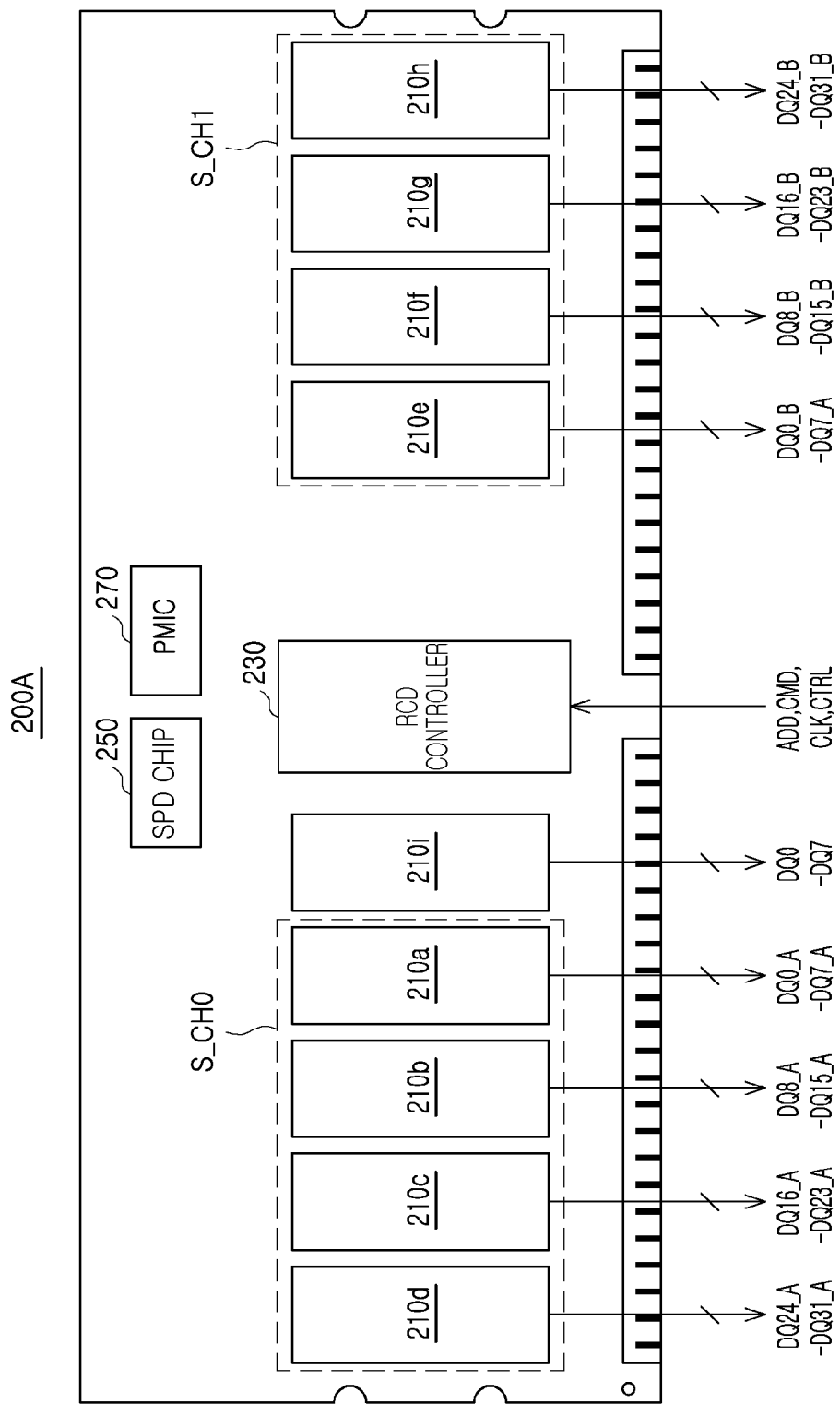
FIG. 5 is a diagram illustrating a memory module according to an exemplary embodiment.
Figure 7:
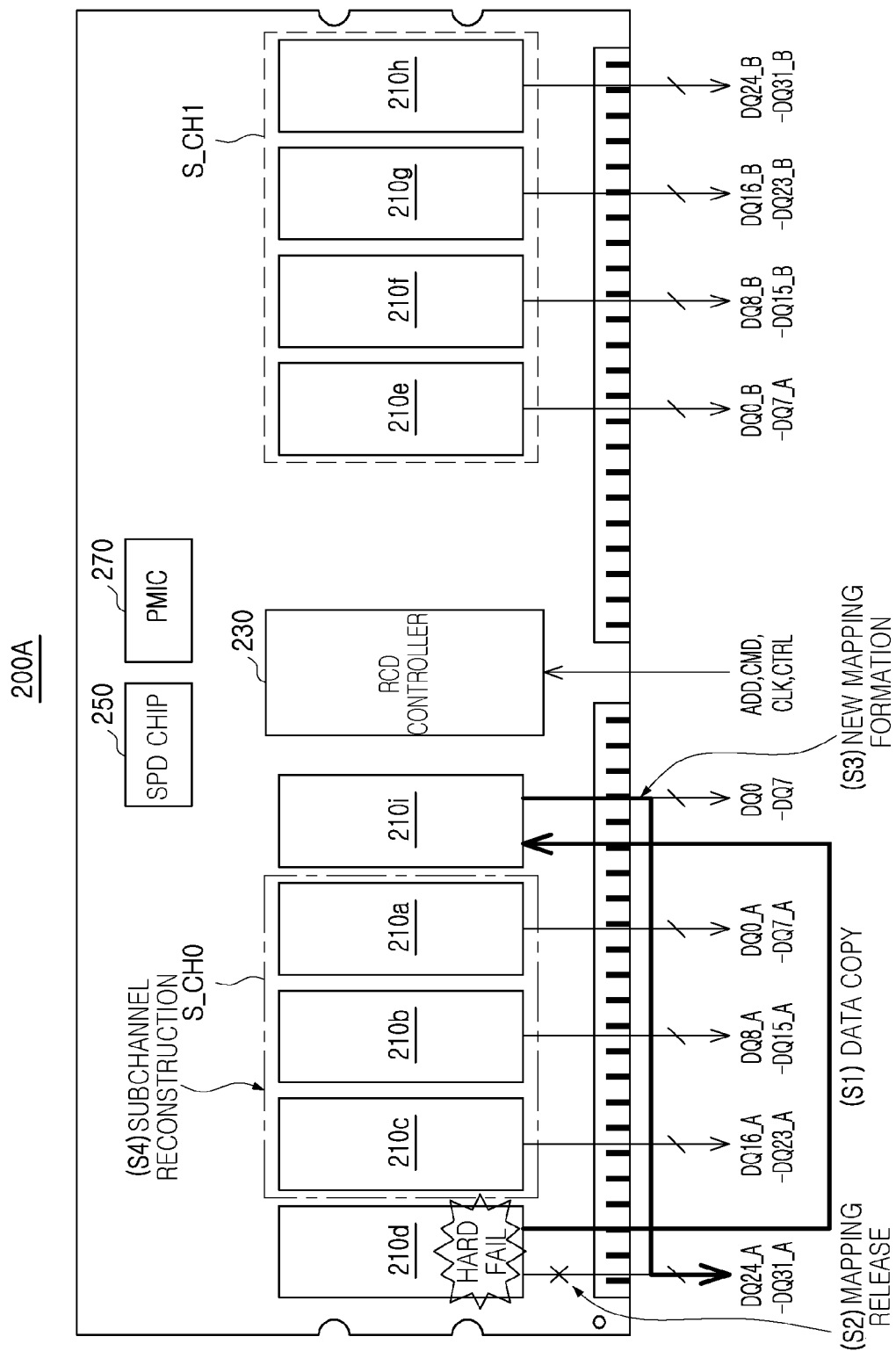
FIG. 7 is a diagram illustrating a chip-kill operation of the memory module of FIG. 5.

Hereafter, a memory module capable of performing a chip-kill operation according to embodiments of the inventive concept will be described in some additional detail with reference to FIGS. 5, 6 and 7, where FIG. 5 is a block diagram illustrating a memory module according to embodiments of the inventive concept; FIG. 6 conceptually illustrates a pin-map that may be used in the memory module of FIG. 5; and FIG. 7 is another block diagram further illustrating in one example a chip-kill operation that may be performed by the memory module of FIG. 5.

Referring to FIG. 5, a memory module 200A is assumed having a dual in-line memory module (DIMM) configuration conforming to relevant joint electron device engineering council (JEDEC) standard(s). For example, the memory module 200A may include a registered DIMM (RDIMM), a load reduced DIMM (LRDIMM), an unbuffered DIMM (UDIMM), a fully buffered-DIMM (FB-DIMM), or a small outline-DIMM (SO-DIMM).

Memory devices 210a to 210i may be disposed on at least one surface of the memory module 200A. Here, for the sake of clarity, the memory devices 210a to 210i are shown on one surface of the memory module 200A arranged in a single, lateral rank.

Although not illustrated in FIG. 5, the memory module 200A may further include a memory devices disposed on the opposing surface of the memory module 200A. The memory devices may further be disposed in multiple groups or ranks, as required by design or specification.

The memory devices 210a to 210i of FIG. 5 include first to eighth data chips memory devices 210a to 210h and an ECC chip 210i. The first to the fourth data chips 210a to 210d are disposed on a left side of a registered clock driver (RCD) controller 230, while the fifth to the eight data chips 210e to 210h may be disposed on a right side. The memory module 200A uses the first to the fourth data chips 210a to 210d to configure a first sub-channel S_CH0, and the fifth to the eight data chips 210e to 210h to configure a second sub-channel S_CH1.

Various I/O pins (DQ pins) may be mapped to the first to the eighth data chips 210a to 210h. For example, the data chips 210a to 210d included in the first sub-channel S_CH0 may be mapped to first to thirty-second DQ_A pins DQ0_A to DQ31_A, and the data chips 210e to 210h included in the second sub-channel S_CH1 may be mapped to first to thirty-second DQ_B pins DQ0_B to DQ31_B.

Here, the memory devices 210a to 210i are assumed to have a X8 data bus width mapped to eight (8) DQ pins. The memory devices 210a to 210i may communicate data to one or more external source via the mapped DQ pins.

Mapping information (e.g., a pin-map) between the memory devices 210a to 210i and the DQ pins may be stored and managed in the form of a table by the pin-map manager 110 of the memory controller 100 of FIG. 2.

Referring to FIG. 6, an exemplary pin-map PM may be used to store information associated with pin numbers (Pin

) and/or pin names (Pin_name) for the DQ pins, as well as one or more memory device(s) mapped to the DQ pins (Chip #).

The memory module 200A may configure the first and the second sub-channels S_CH0 and S_CH1 in the lockstep mode. In this case, the first and the second sub-channels S_CH0 and S_CH1 may share the ECC chip 210i. The ECC chip 210i may provide an first ECC for first data stored in the first to the fourth data chips 210a to 210d and an second ECC for second data stored in the fifth to the eighth data chips 210e to 210h. In certain embodiments of the inventive concept, ECC may include at least one of parity data and CRC.

Based on the first data read from the first to the fourth data chips 210a to 210d and the first ECC provided by the ECC chip 210i, a first code word may be generated. Further, a second code word may be generated based on the second data read from the fifth to the eighth data chips 210e to 210h and the second ECC provided by the ECC chip 210i. In some exemplary embodiments, the size of the first code word and the second code word may be 144 bits (e.g., a 128 bit-data word plus a 16 bit-ECC).

Referring to FIGS. 2 and 5, the RCD controller 230 may be used to control the memory devices 210a to 210i. Further, a serial presence detect (SPD) 250 and a power management integrated circuit (PMIC) 270 under control of the memory controller may be provided. For example, the RCD controller may receive an address ADD signal, a command CMD, a clock CLK signal and/or a control CTRL signal from the memory controller 100. The RCD controller 230, in response to the received signal(s), may control the memory devices 210a to 210j in order to write or read data via the DQ pins DQ0_A to DQ31_A and DQ0_B to DQ31_B.

The RCD controller 230 may serve as a buffer distributing the signals received from the memory controller 100 to the first sub-channel S_CH0 and/or the second sub-channel S_CH1.

When configured in the lockstep mode, the first and the second code words respectively generated in the first and the second sub-channels S_CH0 and S_CH1, may be used to fill a single cache line (CL) according to a (e.g.,) channel interleaving approach.

The SPD chip 250 may include a programmable read-only memory, such as electrically erasable programmable read-only memory (EEPROM), or the like. The SPD chip 250 may store initial information or device information DI of the memory module 200A. For example, the SPD chip 250 may store a module type, a module configuration, an operating environment, a line arrangement, storage capacity and an execution environment of the memory module 200A. When a memory system including the memory module 200A is booted, the host may recognize and control the memory module 200A based on the device information DI read from the SPD chip 250.

In this regard, the SPD chip may be configured to store division information indicating mapping between a plurality of I/O pins in the memory system 30 and a plurality of the data chips and the ECC chip of the memory module 200.

A power management integrated circuit (PMIC) 270 may receive external power and generate a power voltage VDD to supply the same to a plurality of the memory devices 210a to 210i. The memory devices 210a to 210i may operate in response to one or more predetermined power voltage(s) VDD from the PMIC 270.

The ECC chip 210i may be used as a spare chip to replace a hard-fail memory chip among the data chips 210a to 210h.

In other words, the memory module 200A may use the ECC chip 210i as a spare chip to perform a chip-kill operation.

For example, referring to FIG. 7, when the fourth data chip 210d suffers a hard fail, the data previously stored in the fourth data chip 210d is copied to the ECC chip 210i (S). Further, mapping between the fourth data chip 210d and the twenty-fifth to the thirty-second DQ_A pins DQ24_A to DQ31_A may be released (S2), and new mapping may be defined (i.e., remapping) between the ECC chip 210i and the twenty-fifth to the thirty-second DQ_A pins DQ24_A to DQ31_A (S3). In this case, the ECC chip 210i together with the first to third data chips 210a to 210c essentially reconstitutes the first sub-channel S_CH0 (S4), despite the hard-fail of the fourth data chip 210d.

The pin-map manager 110 of the memory controller 100 may be used to store and manage mapping relationships using an updated pin-map (PM). Henceforth, the ECC chip 210i may operate as a data chip communicating data via the twenty-fifth to the thirty-second DQ pins DQ24_A to DQ31_A.

In an exemplary embodiment, a size 'k' of the data word provided by each of the first and the second sub-channels S_CH0 and S_CH1 may be 128 bits. Further, a size of the first and second ECC respectively added to the data words provided by the first and the second sub-channels S_CH0 and S_CH1 may be 16 bits.

Upon completion of the chip-kill operation, the ECC chip 210i will not provide ECC as previously described. However, the memory module 200A may use the k-bit data word provided by the first and the second sub-channels S_CH0 and S_CH1 to fill a single cache line (CL).

Accordingly, the memory module 200A of FIG. 7, may have a reduced number of the ECC chips required for the error correction from 2 to 1 in the case of configuring the first and the second sub-channels S_CH0 and S_CH1 in a single memory module, as compared with the case in which the lockstep mode is configured using two memory modules. Further, the memory module 200A may have a reduced number of the memory chips required for the chip-kill operation by 55%, that is from 20 to 9, as compared to comparative memory module, thereby reducing manufacturing costs.

Figure 8:
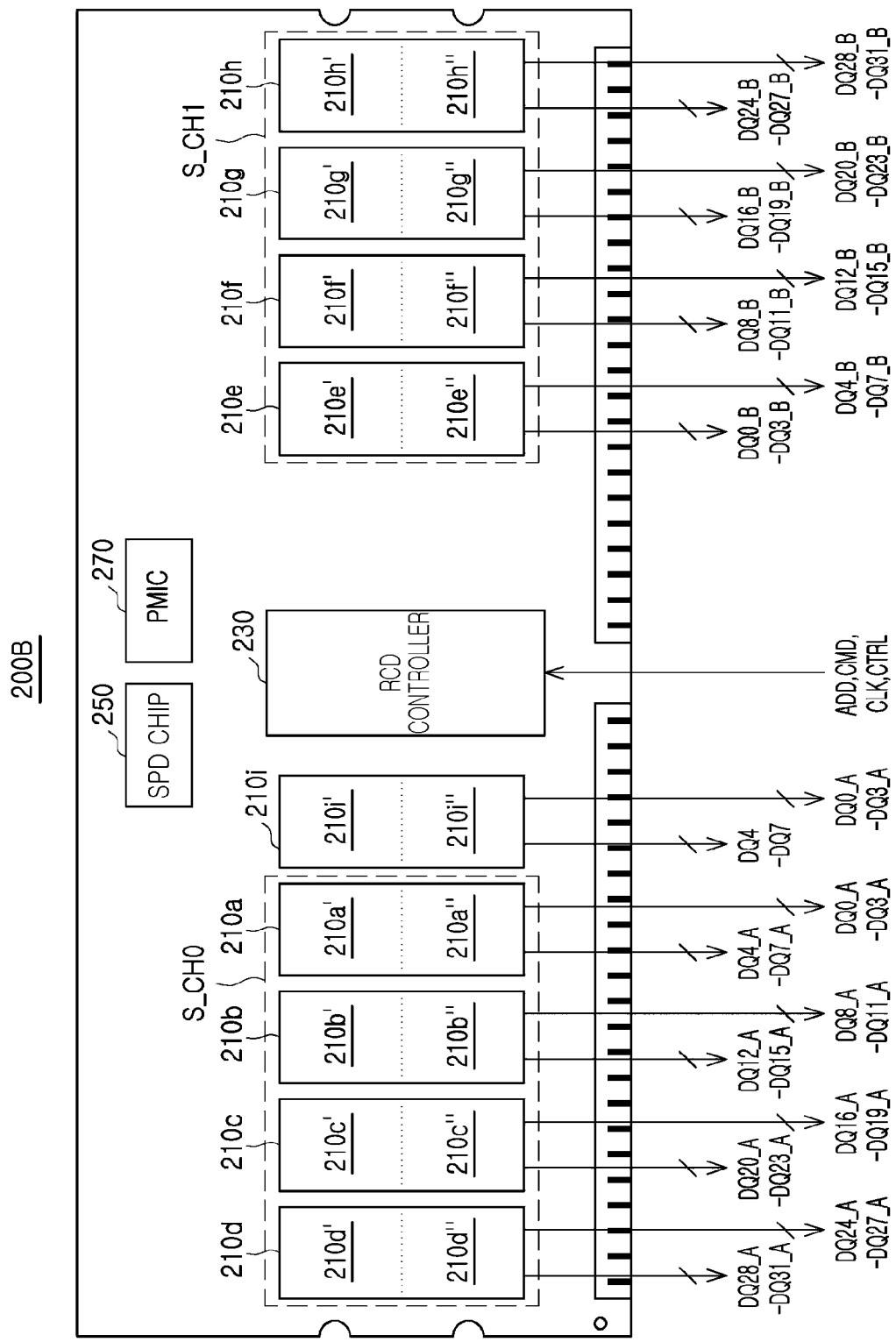
FIG. 8 is a diagram illustrating a memory module according to an exemplary embodiment.
Figure 9:
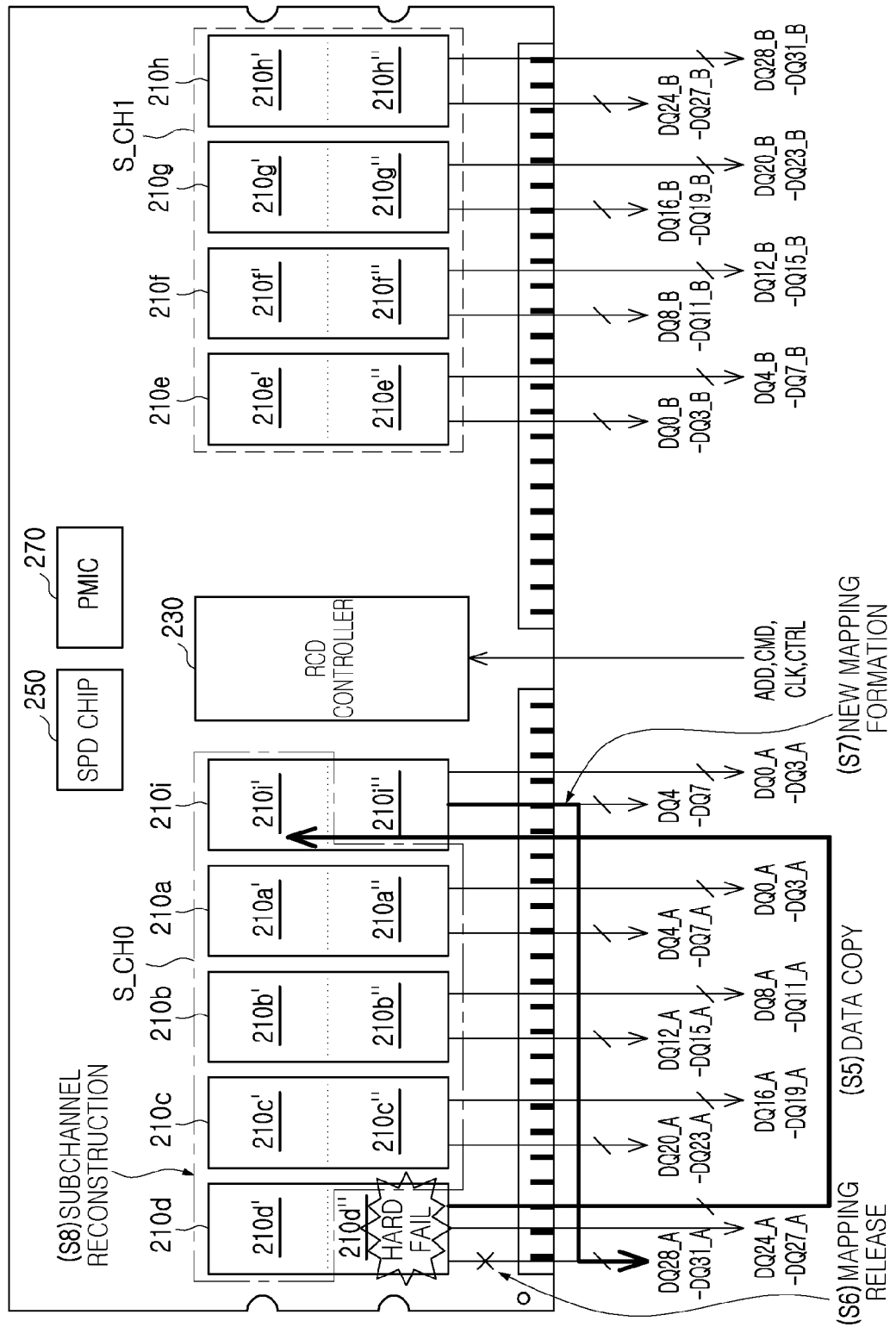
FIG. 9 is a diagram illustrating a chip-kill operation of the memory module of FIG. 8.

FIG. 8 is a block diagram illustrating a memory module according to embodiments of the inventive concept, and FIG. 9 is another block diagram further illustrating a chip-kill operation that may be performed by the memory module of FIG. 8.

Referring to FIG. 8, a memory module 200B may include memory devices 210a to 210i, as well as the RCD controller 230, the SPD chip 250 and the PMIC 270. Here, the memory devices 210a to 210i may include first to eighth data chips 210a to 210h and an ECC chip 210i.

A first set of data chips including first to fourth data chips 210a to 210d may be disposed on a left side of the RCD controller 230 and a second set of data chips including the fifth to eight data chips 210e to 210h may be disposed on a right side. In an exemplary embodiment, the first to the eighth data chips 210a to 210h are configured in a single memory rank.

Each of the memory devices 210a to 210i is assumed to have a X8 data bus width. Each of the memory devices 210a to 210i is mapped to eight (8) I/O pins (DQ pins), and the memory devices 210a to 210i are further assumed to communicate data via the mapped DQ pins.

In the illustrated example of FIG. 8, the memory module 200B may divide a the DQ pins DQ0_A to DQ31_A and DQ0_B to DQ31_B mapped therein into a plurality of groups. For example, the memory module 200B may divide the eight (8) DQ pins mapped in the memory devices 210a to 210i into two (2) groups including four (4) DQ pins each. Accordingly, the DQ pins DQ0_A to DQ31_A and DQ0_B to DQ31_B may be mapped to the memory devices 210a to 210i in two (2) separate groups, wherein each of the memory devices 210a to 210i may be logically divided into two (2) memory device sets having a data bus width that is one-half of the original X9 data bus width. For example, the eight (8) DQ pins mapped to the X8 data chips 210a to 210h may be divided into two groups, the X8 data chips 210a to 210h having two (2) X4 data chips (210a', 210a") to (210h', 210h"). Further, the eight (8) DQ pins mapped to the X8 ECC chip 210i may be divided into two (2) groups, the X8 ECC chip 210i may be logically divided into a first ECC chip 210i' of X4 and a second ECC chip 210i" of X4.

The memory module 200 may configure the first and the second sub-channels S_CH0 and S_CH1 in the lockstep mode. In this case, the first and the second sub-channels S_CH0 and S_CH1 may share the first and the second ECC chips 210i' and 210i". The first and the second ECC chips 210i' and 210i" may be used to store at least one of parity data and CRC. For example, the first ECC chip 210i' may store parity data while the second ECC chip 210i" may store CRC.

Based on the data read from the first to the fourth data chips (210a', 210a") to (210d', 210d") and first ECC provided by the first and the second ECC chip 210i' and 210i", a first code word may be generated. Further, a second code word may be generated based on the data read from the fifth to the eighth data chips (210e', 210e") to (210h', 210h") and second ECC provided by the first and the second ECC chip 210i' and 210i". Here again, as one possible example, the size of each of the first and the second code words may be 144 bits (e.g., a 128 bit-data word plus a 16 bit-ECC).

At least one of the first and the second ECC chip 210i' and 210i" may be used as a spare chip to replace a hard-fail memory among the data chips (210a', 210a") to (210h', 210h"). In other words, the memory module 200B may use either one of the first and the second ECC chip 210i' and 210i" as a spare chip to perform the chip-kill operation. For example, referring to FIG. 9, when a hard fail occurs in a second region 210d" of the fourth data chip 210d, the data stored in the fourth data chip 210d may be copied to the ECC chip 210i' (S5). Mapping between the second region 210d" of the fourth data chip 210d and the twenty-ninth to thirty-second DQ_A pins DQ28_A to DQ31_A may be released (S6), and new mapping defined between the first ECC chip 210i' and the twenty-ninth to thirty-second DQ_A pins DQ28_A to DQ31_A (S7). In this case, the first ECC chip 210i' together with the first to third data chips 210a to 210c and a first region 210d' of the fourth data chip 210d may reconstitute the first sub-channel S_CH0 (S8).

The pin-map manager 110 of the memory controller 100 of FIG. 2, may be used to store and manage the mapping relationships using an updated pin-map (PM). Henceforth, the first ECC chip 210i' may operate as a data chip communicating data through the twenty-ninth to thirty-second DQ pins DQ28_A to DQ31_A.

Here again, as one possible example, a size k of the data word output from each of the first and the second sub-channels S_CH0 and S_CH1 may be 128 bits. Further, a size of the ECC added to the data word output from the first and the second sub-channels S_CH0 and S_CH1 may be 16 bits. And the memory module 200B may use the k-bit data word output from the first and the second sub-channels S_CH0 and S_CH1 to fill a single cache line.

The memory module 200B of FIGS. 8 and 9 may have a reduced number of the ECC chips required for the error correction from 2 to 1 by configuring the lockstep mode, thereby reducing the manufacturing costs. Further, the memory module 200B may divide the DQ pins into a predetermined number of groups to logically divide a plurality of the memory devices 210a to 210i and use at least one of a plurality of the regions of the logically divided ECC chip 210i as a spare chip, thereby simultaneously performing the chip-kill operation and the ECC operation in a single memory module.

Figure 10:
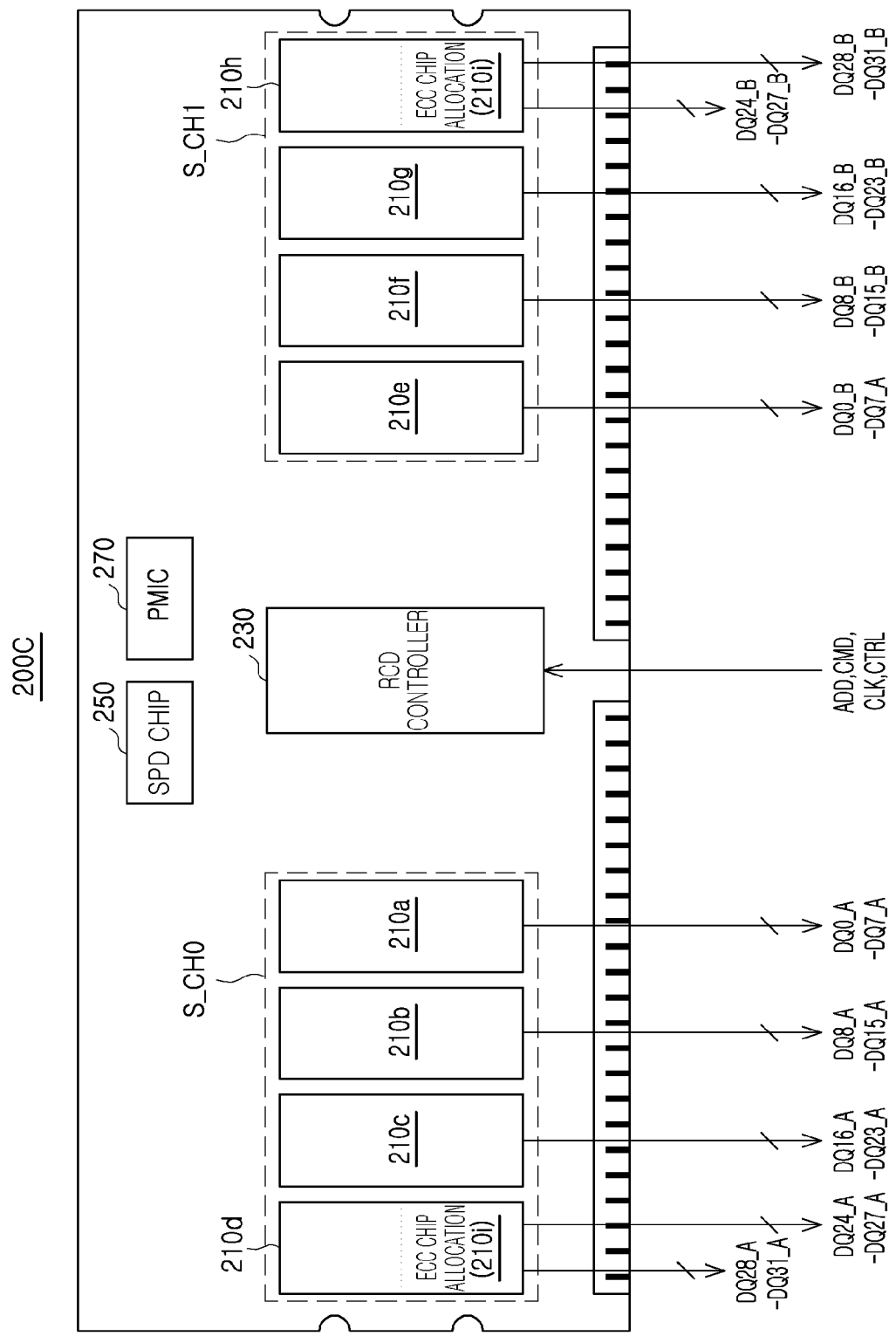
FIG. 10 is a diagram illustrating a memory module according to an exemplary embodiment.
Figure 11:
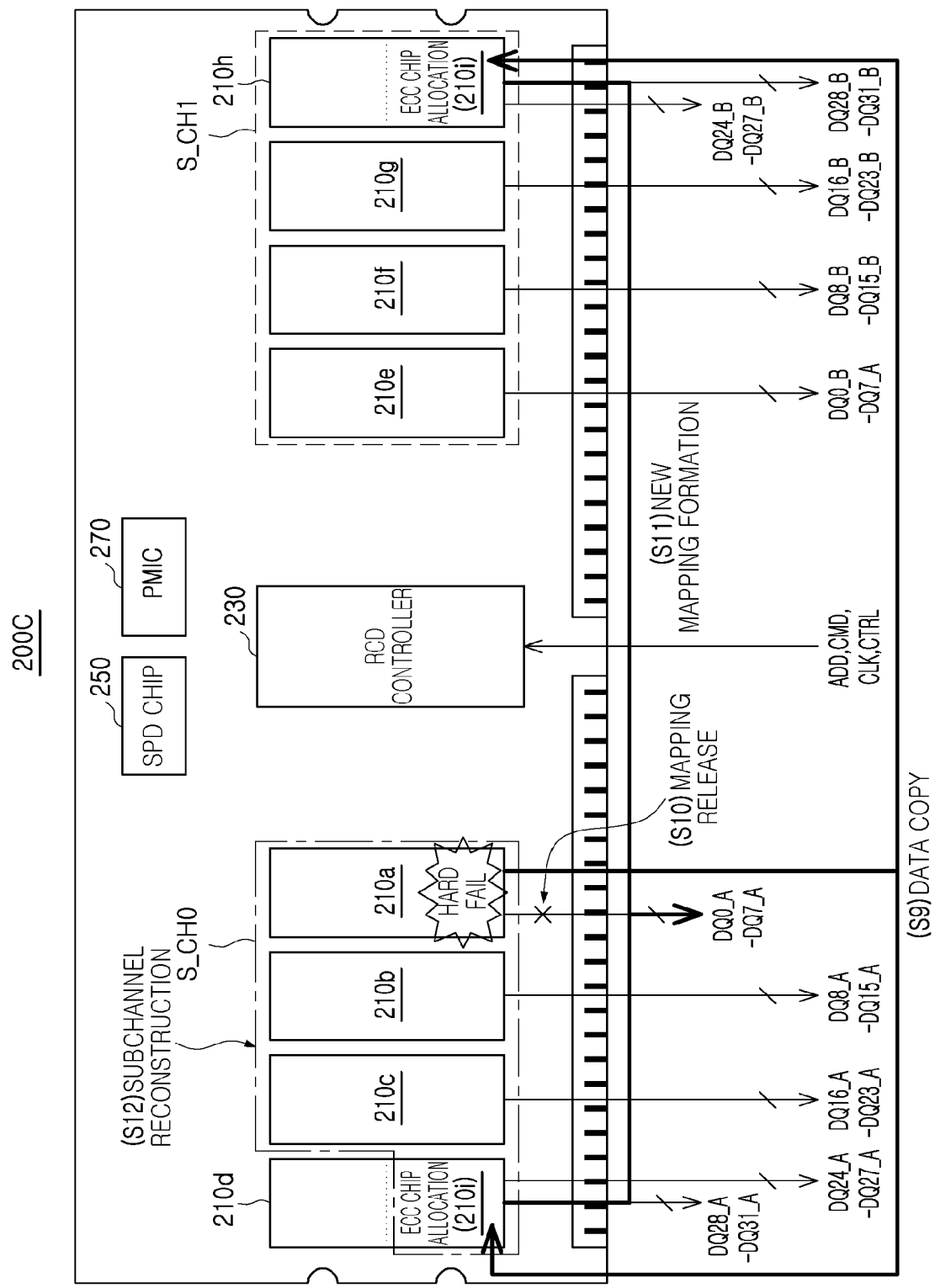
FIG. 11 is a diagram illustrating a chip-kill operation of the memory module of FIG. 10.

FIG. 10 is a block diagram illustrating a memory module according to embodiments of the inventive concept, and FIG. 11 is a diagram further illustrating a chip-kill operation that may be performed by the memory module of FIG. 10.

Referring to FIG. 10, a memory module 200C may include memory devices 210a to 210h, as well as the RCD controller 230, the SPD chip 250 and the PMIC 270.

The memory devices 210a to 210i may include first to eighth data chips 210a to 210h. The first to the fourth data chips 210a to 210d may be disposed on a left side of the RCD controller 230, and the fifth to the eight data chips 210e to 210h may be disposed on a right side. The first to the eighth data chips 210a to 210h may configured in a single memory rank.

The memory module 200C may allocate a first ECC region (210i) from one of the first to the fourth data chips 210a to 210d included in the first sub-channel S_CH0 (and a second ECC region from among the fifth to the eighth data chips 210e to 210h included in the second sub-channel S_CH1) to store first ECC data and second ECC data, respectively. For example, in a case assuming a burst length BL of sixteen (16), and the memory chips 210a to 210h having a X8 data bus width, the memory module 200C may allocate memory space sufficient for the last two bursts of the fourth data chip 210d and those of the eighth data chip 210h for the ECC chips 210i.

Among the first to the eighth data chips 210a-210h, ECC assignment information (EAI) indicating the region allocated for the ECC chip 210i may be stored in the SPD chip 250. When a memory system including the memory module 200C is booted, the host may recognize and control the memory module 200C based on the EAI read from the SPD chip 250.

By allocating only a partial region among the first to the eighth chips 210a to 210h for the ECC chip 210i, a single cache line may not be filled using the data output from the first to the eighth chips 210a to 210h. For example, in the case of the burst length of 16 and the first to the eighth chips 210a to 210h having a X8 data bus width, a data word provide by the first to the eighth chips 210a to 210h may be four (4) (i.e., a number of data bits provide per DQ pin) times eight (8) (i.e., a width of the data bus) times six (6) (a number of data chips) plus two (2) (a number of data I/O per DQ pin) times eight (8) (a data bus width) times two (2) (a number of data chips) equals 224 bits. In the case in which a size of the cache line data is 26 bits, the memory module 200C becomes unable to fill a cache line using the 224 bit-data using a single burst operation. To address this potential issue, a memory system according to embodiments of the inventive concept may employ a zero-padding solution to add dummy bits to the data word provided by the first to the eighth data chips 210a to 210h of the memory module 200C, thereby filling a single cache line. For example, in a previously described example, the memory system may add thirty-two (32) dummy bits having a predetermined value (e.g., a bit value of 0) to the 224 bit-data word provided by the first to the eighth data chips 210a to 210h to generate a 256-bits, thereby filling a single cache line having a data size of 256-bits.

In an exemplary embodiment, a zero-padding support information (ZSI) indicating whether the memory devices 210a to 210h support the zero-padding solution may be stored in the SPD chip 250. For example, the ZSI may be stored in a predetermined region (e.g., the $8^t$ block (0x200-0x23F) or the $9^t$ block ((0x240-0x27F) the SPD chip 250) reserved for storing manufacturing information of a memory device in the SPD chip. Alternately, the ZSI may be stored in a mode register of each of the memory devices 210a to 210h. For example, the ZSI may be stored in a predetermined mode register (e.g., MR62) allocated to a vendor of the memory device. In some exemplary embodiments, when the ZSI has a bit value of 0, the memory devices 210a to 210h may not support the zero-padding solution. In contrast, when the ZSI has a bit value of 1, a plurality of the memory devices 210a to 210h may support the zero-padding solution.

The memory devices 210a to 210h may have a X8 data bus width. In this case, eight (8) I/O pins (DQ pins) may be mapped in each of the memory devices 210a to 210h. The DQ pins mapped in the memory devices 210a to 210h allow data to be externally communicated.

The memory module 200C may configure the first and second sub-channels S_CH0 and S_CH1 in the lockstep mode. In this case, the first and the second sub-channels S_CH0 and S_CH1 may share an ECC chip 210i allocated in a predetermined region. The ECC chip 210i may provide an ECC for an error correction of data read from the first to the fourth data chips 210a to 210d constituting the first sub-channel S_CH0. Further, the ECC chip 210i may provide an ECC for an error correction of data written from the fifth to the eighth data chips 210e to 210h constituting the second sub-channel S_CH1. In an exemplary embodiment, the ECC may include at least one of parity data and CRC.

Based on the data read from the first to the fourth data chips 210a to 210d and the ECC provided from the ECC chip 210i, a first code word may be generated. Further, a second code word may be generated based on the data read from the fifth to the eighth data chips 210e to 210h and the ECC provided from the ECC chip 210i.

The ECC chip 210i may be used as a spare chip to replace a hard-fail memory chip among the data chips 210a to 210h. In other words, the memory module 200C uses the ECC chip 210i as a spare chip to perform the chip-kill operation. For example, referring to FIG. 11, when a hard fail occurs in the first data chip 210a, the data stored in the first data chip 210a may be copied to the ECC chip 210i (S9). Mapping between the first data chip 210a and the first to eights DQ_A pins DQ0_A to DQ7_A may be released (S10), and new mapping may be defined between the ECC chip 210i and the first to eights DQ_A pins DQ0_A to DQ7_A (S11). In this case, the ECC chip 210i together with the second to fourth data chips 210b to 210d may reconstitute the first sub-channel S_CH0 (S12).

The pin-map manager 110 of the memory controller 100 of FIG. 2, may be used to store and manage mapping relationships using an updated pin-map (PM). The ECC chip 210i may be operated as a data chip inputting/outputting the data through the first to eights DQ_A pins DQ0_A to DQ7_A. In this case, the ECC chip 210i may no longer provide an ECC.

In an exemplary embodiment, a size k of the data word output from each of the first and the second sub-channels S_CH0 and S_CH1 may be 128 bits. Further, a size of the ECC added to the data word output from the first and the second sub-channels S_CH0 and S_CH1 may be 16 bits.

The memory module 200C may use the k-bit data word output from the first and the second sub-channels S_CH0 and S_CH1 configuring the lockstep mode to fill a single cache line having a data size of k×2 bits.

The memory module 200C of FIGS. 10 and 11 may reduce a number of the memory chips required for the chip-kill operation by 20% (e.g., from 10 to 8) by configuring the lockstep mode using the first and the second sub-channels S_CH0 and S_CH1, thereby reducing the manufacturing costs of the memory module as compared to the case of including 2 ECC chips.

Figure 12:
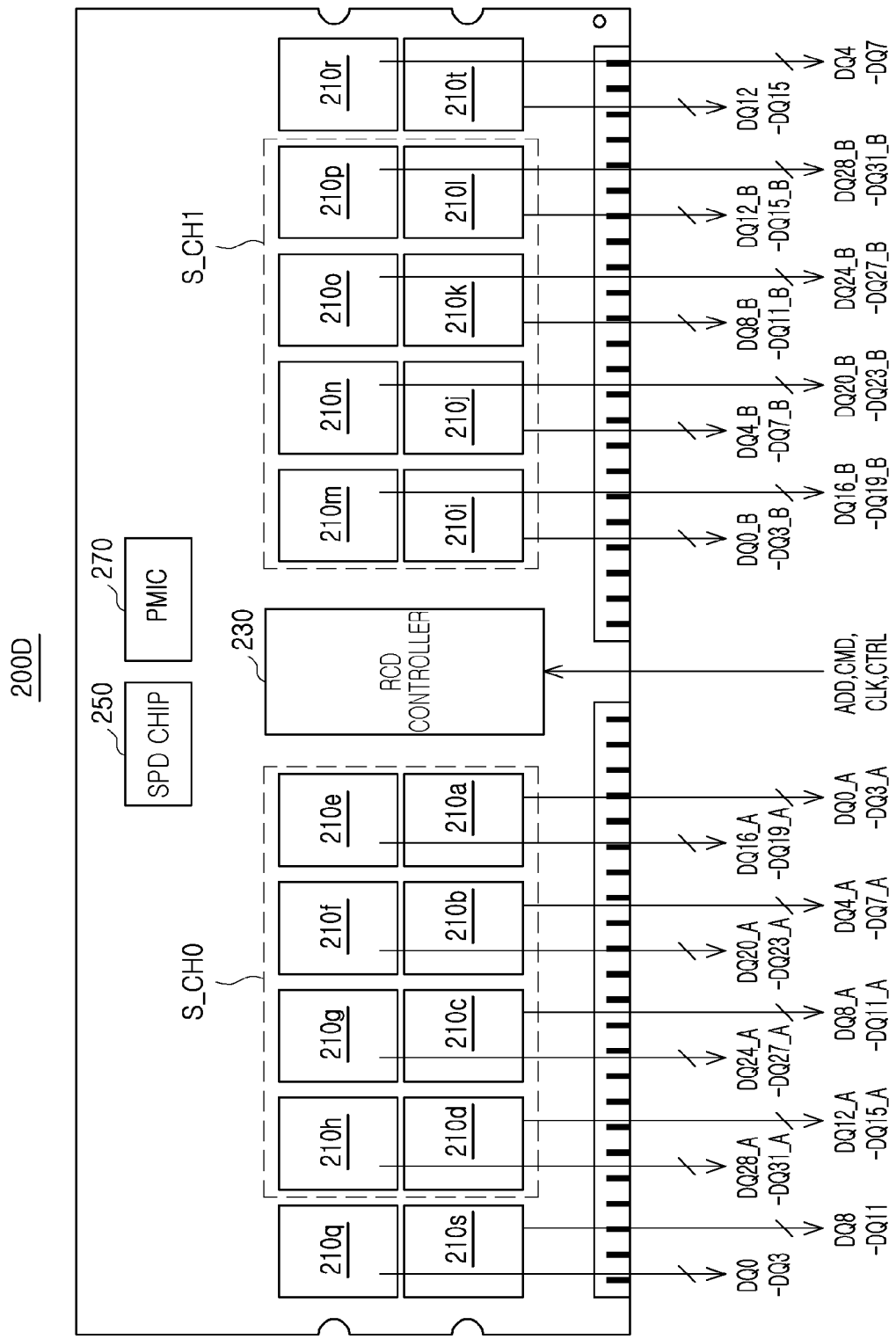
FIG. 12 is a diagram illustrating a memory module according to an exemplary embodiment.
Figure 13:
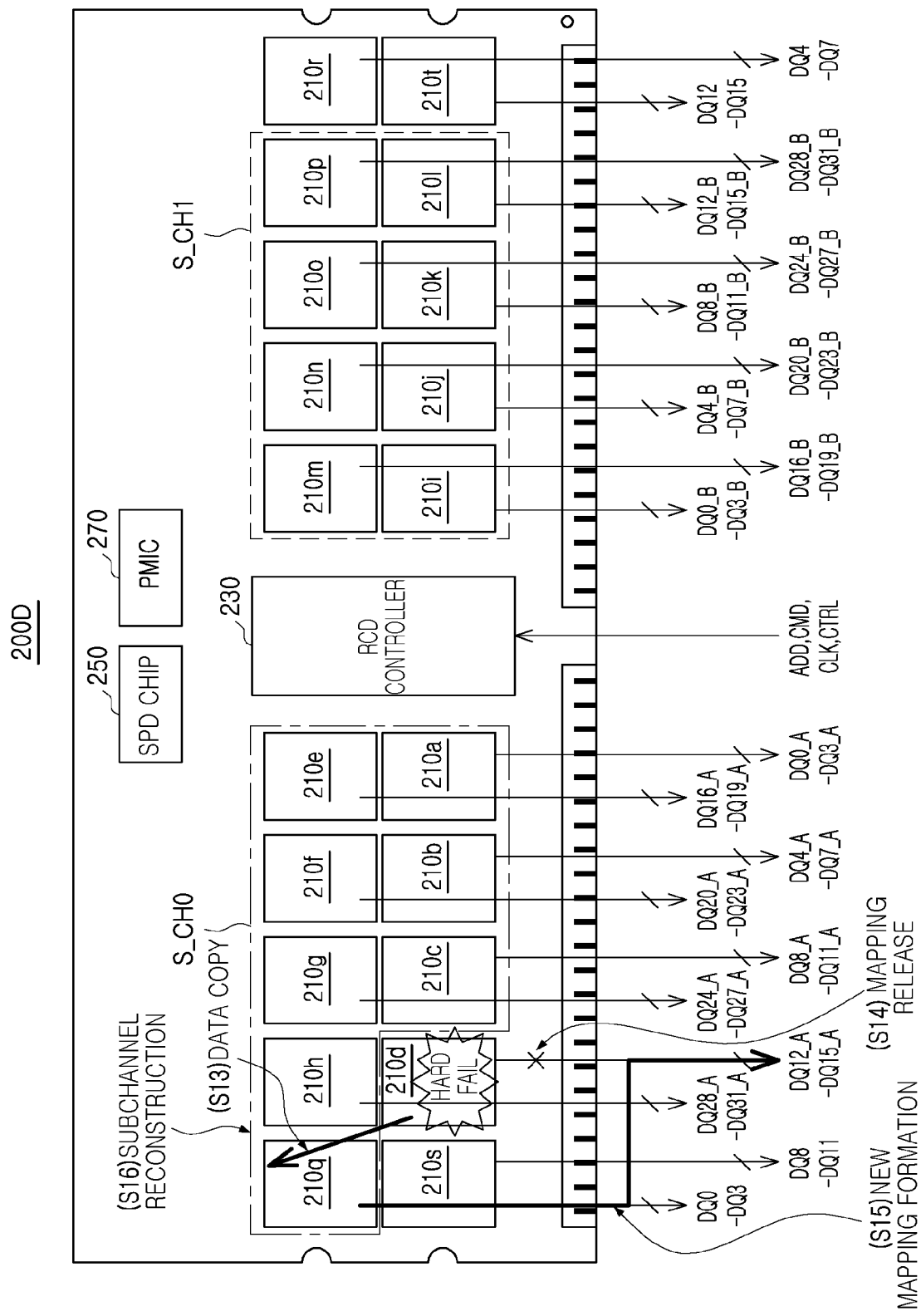
FIG. 13 is a diagram illustrating a first chip-kill operation of the memory module of FIG. 12.
Figure 14:
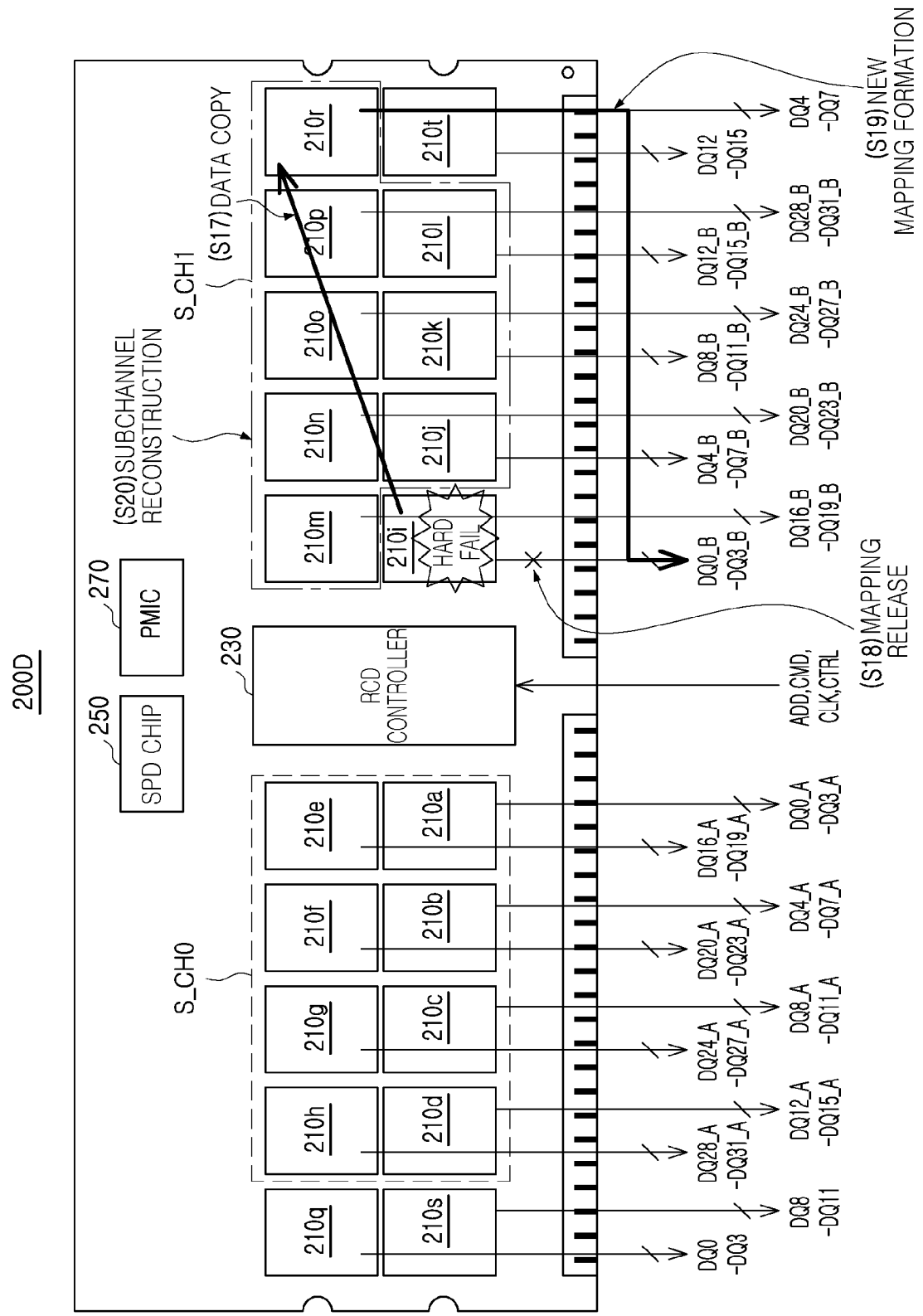
FIG. 14 is a diagram illustrating a second chip-kill operation of the memory module of FIG. 12.

FIG. 12 is a block diagram illustrating a memory module according to an embodiments of the inventive concept; FIG. 13 is another diagram further illustrating a first chip-kill operation that may be performed by the memory module of FIG. 12; and FIG. 14 is still another diagram illustrating a second chip-kill operation that may be performed by the memory module of FIG. 12.

Referring to FIG. 12, a memory module 200D may include memory devices 210a to 210t arranged in two lateral ranks across the module, as well as the RCD controller 230, the SPD chip 250 and the PMIC 270. That is, the memory devices 210a to 210t may include first to sixteenth data chips 210a to 210p, and first to fourth ECC chips 210q to 210t.

The first to the eighth data chips 210a to 210h may be disposed on a left side of the RCD controller 230 to configure a first sub-channel S_CH0, and the ninth to the sixteenth data chips 210i to 210p may be disposed on a right side thereof to configure a second sub-channel S_CH1.

I/O pins (DQ pins) may be mapped in the first to the sixteenth data chips 210a to 210p. For example, the first to the eighth data chips 210a to 210h included in the first sub-channel S_CH0 may be mapped with the first to the thirty-second DQ_A pins DQ0_A-DQ31_A, and the ninth to the sixteenth data chips 210i to 210p included in the second sub-channel S_CH1 may be mapped with the first to the thirty-second DQ_B pins DQ0_B-DQ31_B.

Each of the memory devices 210a to 210t may have a 4× data bus width. In this case, 4 DQ pins may be mapped in each of the memory devices 210a to 210t, and the memory devices 210a to 210t may communicate data to an external source via the mapped DQ pins.

Mapping information (e.g., a pin-map) between the memory devices 210a to 210t and the DQ pins may be stored and managed by the pin-map manager 110 of the memory controller 100 of FIG. 2 using (e.g.,) a table.

The memory module 200D may use the first and the second sub-channels S_CH0 and S_CH1 to configure the lockstep mode. Here, the first and the second sub-channels S_CH0 and S_CH1 may share the first to the fourth ECC chips 210q to 210t. The first to the fourth ECC chips 210q to 210t may provide first ECC for data read from the first to the eighth data chips 210a to 210h configuring the first sub-channel S_CH0 and second ECC for the data read from the ninth to the sixteenth data chips 210i to 210p. The first to the fourth ECC chips 210q to 210t may store at least one of parity data and CRC. For example, the first and the second ECC chips 210q and 210r may store parity data while the third and fourth ECC chips 210s and 210t may store CRC.

Based on the data read from the first to the eighth data chips 210a to 210h and the first ECC provided by the first to the fourth ECC chips 210q to 210t, a first code word may be generated. Further, a second code word may be generated based on the data read from the ninth to the sixteenth data chips 210*i* to 210*p* and the second ECC provided from the first to the fourth ECC chips 210*q* to 210*t*.

Either one of the first and the second ECC chips 210*q* and 210*r* may be used as a replacement (i.e., a spare chip) for a hard-fail memory chip among the data chips 210*a* to 210*p*. In other words, the memory module 200D may use the first and the second ECC chips 210*q* and 210*r* as spare chips to perform a chip-kill operation.

Referring to FIG. 13, when a first hard-fail occurs in the fourth data chip 210*d*, the memory module 200D may perform a first chip-kill operation. The data stored in the first hard-fail (fourth) data chip 210*d* may be copied to the first ECC chip 210*q* (S13). Mapping between the fourth data chip 210*d* and the thirteenth to sixteenth DQ_A pins DQ12_A to DQ15_A may then be released (S14), and new mapping may be defined between first ECC chip 210*q* and the thirteenth to sixteenth DQ_A pins DQ12_A to DQ15_A (S15). In this case, the first ECC chip 210*q* together with the first to third data chips 210*a* to 210*c* and the fifth to the eighth data chips 210*e* to 210*h* may reconstitute the first sub-channel S_CH0 (S16).

The pin-map manager 110 of the memory controller 100 of FIG. 2 may be used to manage and store mapping relationships using an updated pin-map. The first ECC chip 210*q* may operate as a data chip communicating data through the thirteenth to sixteenth DQ_A pins DQ12_A to DQ15_A. Further, the second to fourth ECC chips 210*r* to 210*t* may provide an ECC for an error correction of data read from the first and the second sub-channels S_CH0 and S_CH1. The memory module 200D may use the k-bit data word output from the first and the second sub-channels S_CH0 and S_CH1 to fill a single cache line having a data size of k×2 bits.

When another hard fail (a second hard-fail) occurs in one of the other data chips 210*a* to 210*c* and 210*e* to 210*p* following the first chip-kill operation, the memory module 200D may use the other one of the first and the second ECC chips 210*q* and 210*r* not used in the first chip-kill operation as a spare chip in order to perform a second chip-kill operation.

Referring to FIG. 14, and assuming a second hard fail occurring in the ninth data chip 210*i*, the memory module 200D may perform the second chip-kill operation. Hence, the data stored in the hard-fail, ninth data chip 210*i* may be copied to the second ECC chip 210*r* (S17). Mapping between the ninth data chip 210*i* and the first to the fourth DQ_B pins DQ0_B to DQ3_B may then be released (S18), and new mapping may be defined between the ninth ECC chip 210*i* and the first to the fourth DQ_B pins DQ0_B to DQ3_B (S19). In this case, the second ECC chip 210*r* together with the tenth to sixteenth data chips 210*j* to 210*h* may reconstitute the second sub-channel S_CH1 (S20).

The pin-map manager 110 of the memory controller 100 of FIG. 2, may be used to manage and store mapping relationships using an updated pin-map. The second ECC chip 210*r* may operate as a data chip communicating data through the first to the fourteenth DQ_B pins DQ0_A to DQ13_B. In this case, the third and fourth ECC chips 210*s* and 210*t* may provide ECCs for error corrections of data read from the first and the second sub-channels S_CH0 and S_CH1.

In an exemplary embodiment, a size k of the data word output from each of the first and the second sub-channels S_CH0 and S_CH1 may be 128 bits. Further, a size of the ECC added to the data word output from the first and the second sub-channels S_CH0 and S_CH1 may be 32 bits.

The memory module 200D may use the k-bit data word output from the first and the second sub-channels S_CH0 and S_CH1 configuring the lockstep mode to fill a single cache line having a data size of k×2 bits.

The memory module 200D of FIGS. 12,13 and 14 may have a reduced number of the memory chips required for the chip-kill operation by about 44%, that is, from 36 to 20, by configuring the lockstep mode using the first and the second sub-channels S_CH0 and S_CH1, thereby reducing the manufacturing costs of the memory module as compared with configurations including 2 memory modules.

Figure 15:
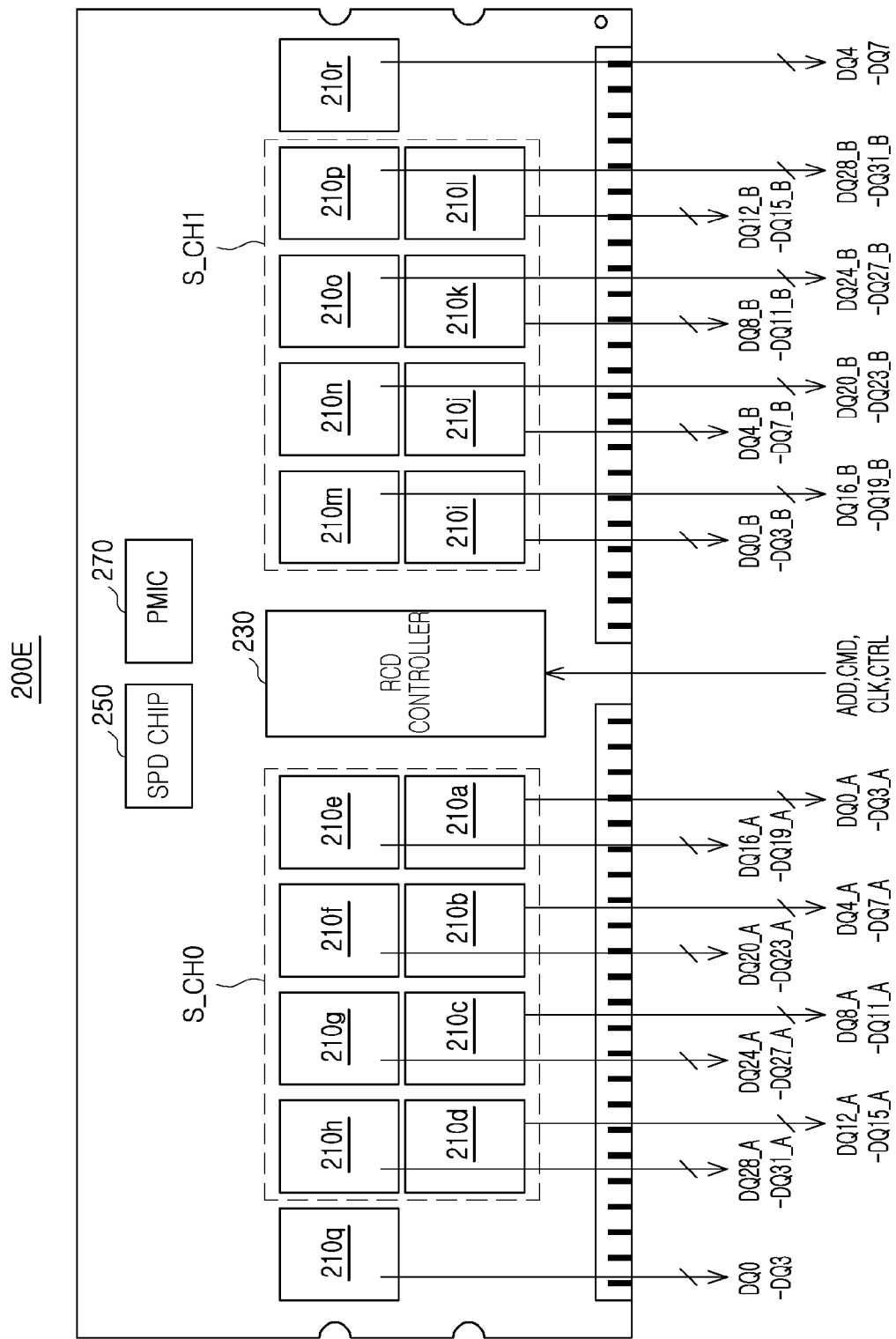
FIG. 15 is a diagram illustrating a memory module according to an exemplary embodiment.
Figure 16:
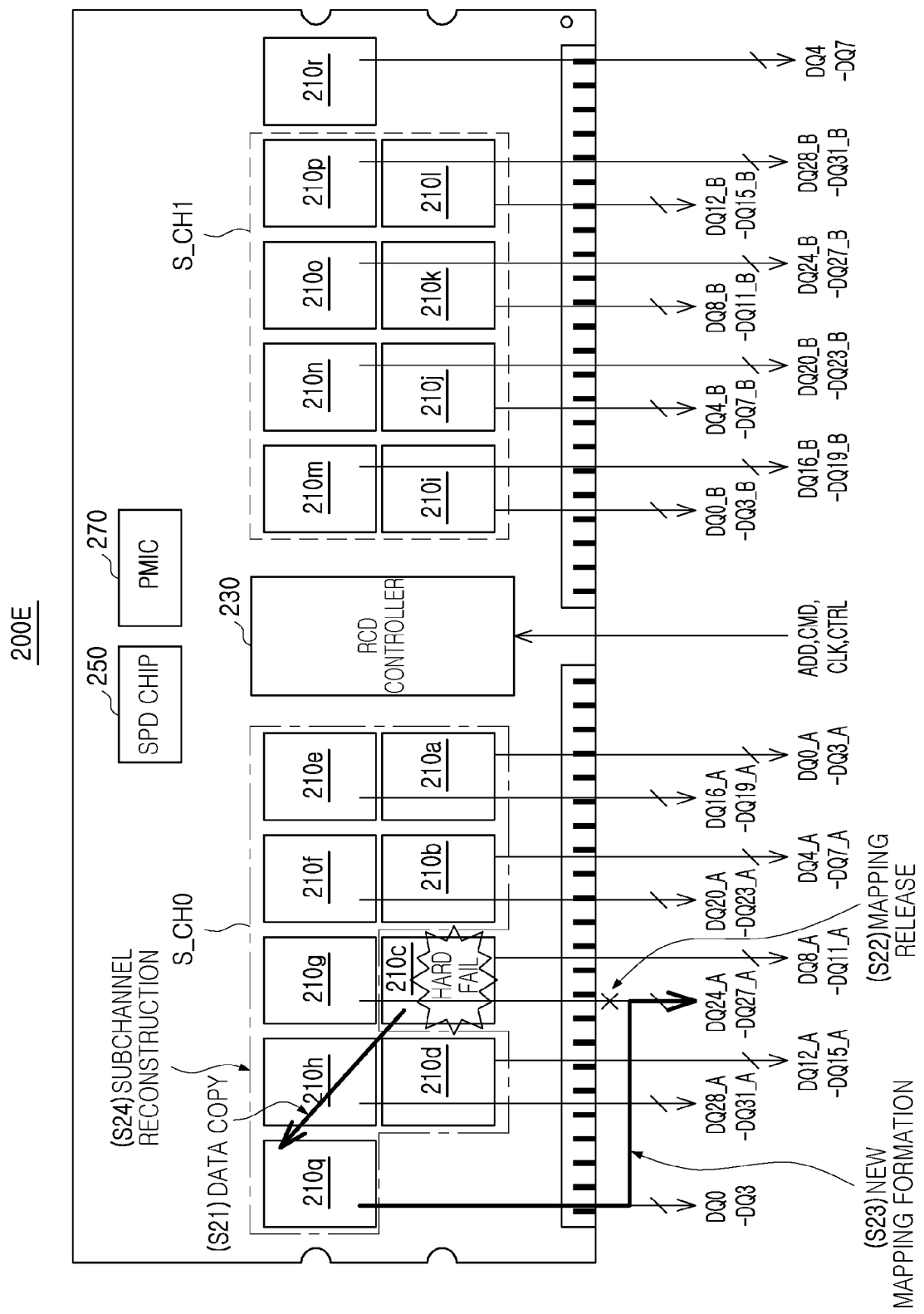
FIG. 16 a diagram illustrating a chip-kill operation of the memory module of FIG. 15.

FIG. 15 is a block diagram illustrating a memory module according to embodiments of the inventive concept, and FIG. 16 a block diagram further illustrating a chip-kill operation that may be performed by the memory module of FIG. 15.

Referring to FIG. 15, a memory module 200E may include memory devices 210*a* to 210*r* arranged in two lateral ranks across the module, as well as the RCD controller 230, the SPD chip 250 and the PMIC 270. That is, the memory devices 210*a* to 210*r* may include first to sixteenth data chips 210*a* to 210*p*, and first and second ECC chips 210*q* to 210*r*.

The first to the eighth data chips 210*a* to 210*h* may be disposed on a left side of the RCD controller 230 to configure a first sub-channel S_CH0, while the ninth to the sixteenth data chips 210*i* to 210*p* may be disposed on a right side thereof to configure a second sub-channel S_CH1.

I/O pins (e.g., DQ pins) may be mapped in the first to the sixteenth data chips 210*a* to 210*p*. For example, the first to the eighth data chips 210*a* to 210*h* included in the first sub-channel S_CH0 may be mapped with the first to the thirty-second DQ_A pins DQ0_A-DQ31_A, and the ninth to the sixteenth data chips 210*i* to 210*p* included in the second sub-channel S_CH1 may be mapped with the first to the thirty-second DQ_B pins DQ0_B-DQ31_B.

Each of the memory devices 210*a* to 210*r* may have a X4 data bus width. In this case, 4 DQ pins may be mapped in each of the memory devices 210*a* to 210*r* and may communicate data to an external source via the mapped DQ pins.

Mapping information (e.g., a pin-map) between the memory devices 210*a* to 210*r* and the DQ pins may be stored and managed (e.g.,) in the form of a table by the pin-map manager 110 of the memory controller 100 of FIG. 2.

The memory module 200E may configure the first and the second sub-channels S_CH0 and S_CH1 in the lockstep mode. In this case, the first and the second sub-channels S_CH0 and S_CH1 may share the first to second ECC chips 210*q* to 210*r*. The first to second ECC chips 210*q* to 210*r* may provide an ECC for the data read from the first to the eighth data chips 210*a* to 210*h* configuring the first sub-channel S_CH0 and an ECC for the data read from the ninth to the sixteenth data chips 210*i* to 210*p*. The first and the second ECC chips 210*q* to 210*r* may store at least one of parity data and CRC.

Based on the data read from the first to the eighth data chips 210*a* to 210*h* and the ECC provided from the first to second ECC chips 210*q* and 210*r*, a first code word may be generated. Further, a second code word may be generated based on the data read from the ninth to the sixteenth data chips 210*i* to 210*p* and the ECC provided from the first and the second ECC chips 210*q* and 210*r*.

The first and the second ECC chips 210*q* and 210*r* may be used as spare chips for replacing a hard-fail memory chip among the data chips 210*a* to 210*p*. In other words, the memory module 200E uses one of the first and the second ECC chips 210q and 210r as a spare chip to perform a chip-kill operation.

Referring to FIG. 16, and assuming a hard fail occurs in the third data chip 210c, the data stored in the third data chip 210c may be copied to the first ECC chip 210q (S21). Mapping between the third data chip 210c and the tenth to thirteenth DQ_A pins DQ11_A to DQ14_A may then be released (S22), and new mapping may be defined between first ECC chip 210q and the tenth to thirteenth DQ_A pins DQ11_A to DQ14_A (S23). In this case, the first ECC chip 210q together with the first, second and fourth to eighth data chips 210a, 210b and 210d to 210h may reconstitute the first sub-channel S_CH0 (S24).

The pin-map manager 110 of the memory controller 100 of FIG. 2 may be used to manage and store mapping relationships using an updated pin-map. The first ECC chip 210q may operate as a data chip communicating data via the thirteenth to sixteenth DQ_A pins DQ12_A to DQ15_A. Further, the first ECC chip 210q may operate as a data chip communicating data through the tenth to thirteenth DQ_A pins DQ11_A to DQ14_A. In this case, the second ECC chip 210r may provide an ECC for an error correction of data read from the first and the second sub-channels S_CH0 and S_CH1.

In an exemplary embodiment, a size k of the data word output from each of the first and the second sub-channels S_CH0 and S_CH1 may be 128 bits. Further, a size of the ECC added to each data may be 16 bits.

The memory module 200E may use the k-bit data word output from the first and the second sub-channels S_CH0 and S_CH1 configuring the lockstep mode to fill a single cache line having a data size of k×2 bits.

The memory module 200E of FIGS. 15 and 16, may have a reduced number of the ECC chips from 4 to 2, by configuring the lockstep mode using the first and the second sub-channels S_CH0 and S_CH1, as compared to the case of configuring the lockstep mode using 2 memory modules. Further, the memory module 200E according to an exemplary embodiment can have a reduced number of the memory chips required for the chip-kill operation from 36 to 18, thereby reducing the manufacturing costs of the memory module.

Figure 17:
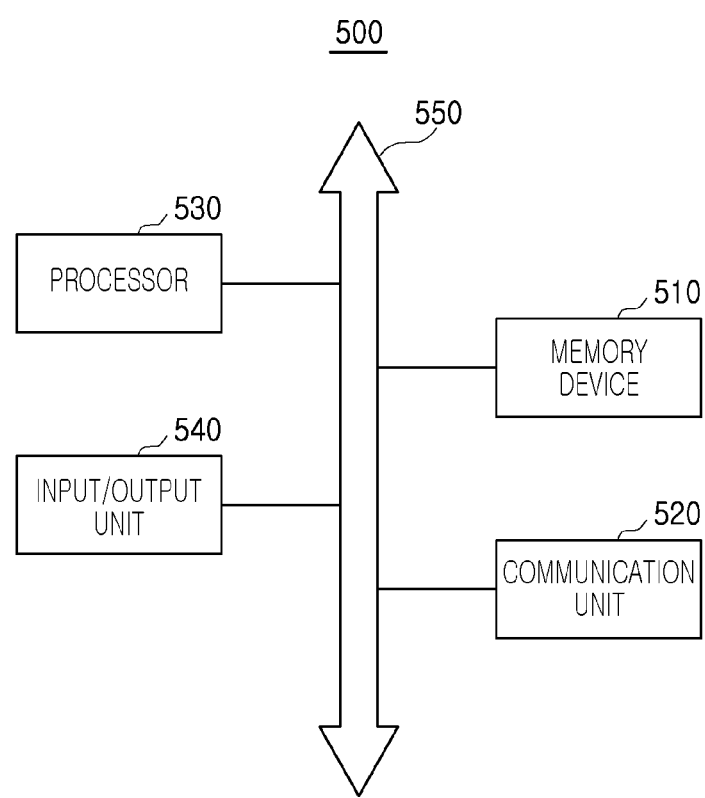
FIG. 17 is a diagram illustrating an electronic device including a memory module according to an exemplary embodiment.

FIG. 17 is a block diagram illustrating an electronic device 500 including a memory module according to embodiments of the inventive concept.

The electronic device 500 may include a memory device 510, a communication unit 520, a processor 530, an input/output (I/O) unit 540, and the like. The memory device 510, the communication unit 520, the processor 530 and the I/O unit 540 may communicate with one another via a bus 550. In addition to the above illustrated components, the electronic device 500 may further include a power supply apparatus, a port, or the like.

The processor 530 may perform specific operations, instructions, tasks, and the like. The processor 530 may be a central processing unit (CPU), a microprocessor unit (MCU), an application processor (AP), or the like, and may communicate with other components such as the memory device 510, the communication unit 520, the I/O unit 540, and the like, through the bus 550.

The memory device 510 included in the electronic device 500 may include the memory modules according to the various embodiments of the inventive concept. As an example, the memory device 510 may operate in accordance with one or more of the embodiments described in relation to FIGS. 1 to 16.

As set forth above, according to embodiments of the inventive concept, a memory module may utilize a plurality of sub-channels to configure a lockstep mode, thereby reducing a number of memory chips required for error correction.

Further, a smaller number of memory chips may be used to perform a chip-kill operation, thereby reducing manufacturing costs for memory modules.

Various advantages and beneficial effects of the inventive concept are not limited to the above descriptions and may be easily understood in the course of describing the specific embodiments of the inventive concept.

While exemplary embodiments have been shown and described above, it will be apparent to those skilled in the art that various modifications can be made without departing from the scope of the inventive concept.

What is claimed is:

1. A memory system, comprising:
a memory module comprising:
a plurality of data chips configured to store data, wherein each one of the plurality of data chips is assigned to one of a first sub-channel that generates a first code word and a second sub-channel that generates a second code word, and the first code word and the second code are used to fill a single cache line;
an error correction code (ECC) chip configured to store ECC associated with the data; and
a registered clock driver (RCD) configured to control operation of the plurality of data chips and the ECC chip; and
a memory controller configured, upon detection of a hard-fail data chip among the plurality of data chips, to copy data from the hard-fail data chip to the ECC chip, release mapping between the hard-fail data chip and corresponding input/output (I/O) pins among a plurality of I/O pins, and define new mapping between the ECC chip and the corresponding I/O pins.

2. The memory system of claim 1, wherein the RCD is configured to distribute an address signal, a command signal and a clock signal received from the memory controller between the first sub-channel and the second sub-channel.

3. The memory system of claim 1, wherein each of the plurality of the data chips is configured to perform a burst operation that provides 256-bit data, and the ECC chip is configured to provide 32-bit ECC associated with error correction of the 256-bit data.

4. The memory system of claim 1, wherein the memory controller comprises:
a pin-map manager configured to store and manage a pin-map including mapping information between the plurality of data chips and the ECC chip and the plurality of the I/O pins.

5. The memory system of claim 4, wherein the plurality of the data chips includes no more than eight (8) data chips.

6. The memory system of claim 4, wherein the memory controller is configured to divide each one of the plurality of the data chips and the ECC chip into a first region and a second region.

7. The memory system of claim 6, wherein each one first region and each second region has a 4-bit data bus width.

8. The memory system of claim 7, wherein the memory controller is further configured to copy data from a first region of the hard-fail data chip to a first region of the ECC chip, release mapping between the hard-fail data chip and corresponding I/O pins, and define new mapping between the first region of the ECC chip and the corresponding I/O pins.

9. The memory system of claim 7, wherein the memory module further comprises:
 a serial presence detect SPD configured to store division information indicating mapping between the plurality of I/O pins and the plurality of the data chips and the ECC chip.

* * * * *